United States Patent
Sato

(10) Patent No.: US 9,514,938 B2
(45) Date of Patent: Dec. 6, 2016

(54) METHOD OF FORMING PATTERN

(71) Applicant: KABUSHIKI KAISHA TOSHIBA, Tokyo (JP)

(72) Inventor: Hironobu Sato, Ibaragi (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 255 days.

(21) Appl. No.: 14/181,303

(22) Filed: Feb. 14, 2014

(65) Prior Publication Data

US 2014/0370195 A1    Dec. 18, 2014

(30) Foreign Application Priority Data

Jun. 12, 2013  (JP) ................................ 2013-123840

(51) Int. Cl.
| | | |
|---|---|---|
| *B29C 35/00* | (2006.01) | |
| *H01L 21/027* | (2006.01) | |
| *G03F 7/00* | (2006.01) | |
| *H01L 21/033* | (2006.01) | |
| *B81C 1/00* | (2006.01) | |

(52) U.S. Cl.
CPC ....... *H01L 21/0271* (2013.01); *B81C 1/00031* (2013.01); *G03F 7/002* (2013.01); *H01L 21/0332* (2013.01); *H01L 21/0337* (2013.01); *B81C 2201/0149* (2013.01)

(58) Field of Classification Search
CPC ........... H01L 21/0271; H01L 21/0337; H01L 21/0332
See application file for complete search history.

(56) References Cited

U.S. PATENT DOCUMENTS

| | | |
|---|---|---|
| 8,114,306 B2 | 2/2012 | Cheng et al. |
| 8,287,749 B2 | 10/2012 | Hasegawa et al. |
| 2008/0182402 A1* | 7/2008 | Li .................. H01L 21/0337 438/618 |
| 2009/0191713 A1 | 7/2009 | Yoon et al. |
| 2011/0312185 A1 | 12/2011 | Seino |

FOREIGN PATENT DOCUMENTS

| | | |
|---|---|---|
| JP | 2009182319 A | 8/2009 |
| JP | 2010144120 A | 7/2010 |
| JP | 2010269304 A | 12/2010 |
| JP | 2012004434 A | 1/2012 |
| JP | 2012-064783 A | 3/2012 |
| JP | 2012064878 A | 3/2012 |

OTHER PUBLICATIONS

Japanese Office Action dated Jun. 3, 2016, filed in Japanese counterpart Application No. 2013-123840, 7 pages (with translation).

* cited by examiner

*Primary Examiner* — Xiao Zhao
(74) *Attorney, Agent, or Firm* — Patterson & Sheridan, LLP

(57) ABSTRACT

According to one embodiment, a method of forming a pattern includes applying a polymer material having a first segment and a second segment in openings formed in a guide, heating the polymer material to achieve microphase separation of the polymer material to form a self-assembled pattern which includes a first polymer portion having a cylindrical shape which includes the first segment, and a second polymer portion including the second segment and surrounding a lateral portion of the first polymer portion, and selectively removing the first polymer portion. A molecular weight ratio of the first segment to the second segment in the polymer material is approximately 4:6.

15 Claims, 13 Drawing Sheets

METHOD OF FORMING PATTERN

CROSS-REFERENCE TO RELATED APPLICATION

This application is based upon and claims the benefit of priority from Japanese Patent Application No. 2013-123840, filed Jun. 12, 2013, the entire contents of which are incorporated herein by reference.

FIELD

Embodiments described herein relate generally to a method of forming a pattern.

BACKGROUND

Known lithography techniques for manufacturing a semiconductor device include a double patterning technique using ArF immersion exposure, EUV lithography, nanoimprint, and the like. The related lithography techniques have various drawbacks, such as increases in manufacturing costs or a decrease in throughput, caused by refinement (reduction in the size and spacing) of a pattern.

Under such circumstance, the application of directed self-assembly (DSA) materials has been considered. The self-assembly is generated by spontaneous energy stabilization to form a pattern having a high dimensional accuracy. Particularly, a technique using microphase separation of a block copolymer may form a periodic structure having various shapes with dimensions of several nanometers (nm) to several hundreds of nm utilizing a simple coating and an annealing process. Dot patterns, holes, pillar patterns, or line patterns, having various dimensions, may be formed by changing a composition of the block copolymer.

DETAILED DESCRIPTION

Embodiments provide a method of forming a pattern which may improve the reliability of Directed Self-Assembly, or (DSA), lithography.

According to one embodiment, a method of forming a pattern includes depositing a polymer material having a first segment and a second segment in a recessed portion of a guide having a pattern comprising protrusions and recesses, microphase separating the polymer material to form a self-assembled pattern which has a first polymer portion having a cylindrical shape which includes the first segment, and a second polymer portion including the second segment that surrounds a lateral portion of the first polymer portion, and selectively removing the first polymer portion. A molecular weight ratio of the first segment to the second segment in the polymer material is approximately 4:6.

Hereinafter, exemplary embodiments will be described with reference to the accompanying drawings.

(First Embodiment)

A method of forming a pattern according to a first embodiment will be described below with reference to FIGS. 1A to 5B. In FIGS. 1A to 5B, FIGS. 1B, 2B, 3B, 4B, and 5B illustrate a top surface, and FIGS. 1A, 2A, 3A, 4A, and 5A illustrate a longitudinal section along a line A-A of FIGS. 1B, 2B, 3B, 4B, and 5B.

Figure 1A:
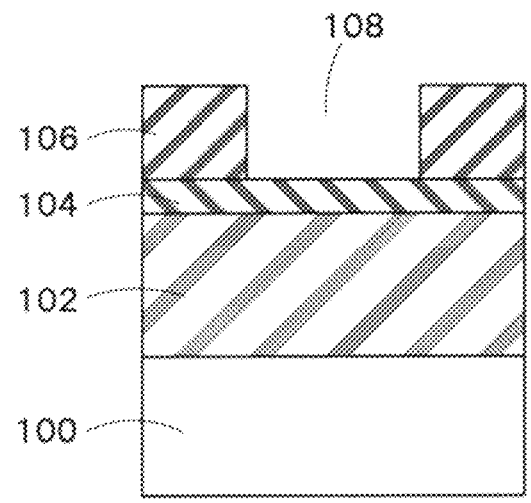
FIGS. 1A and 1B are cross-sectional views illustrating a method of forming a pattern according to a first embodiment.
Figure 1B:
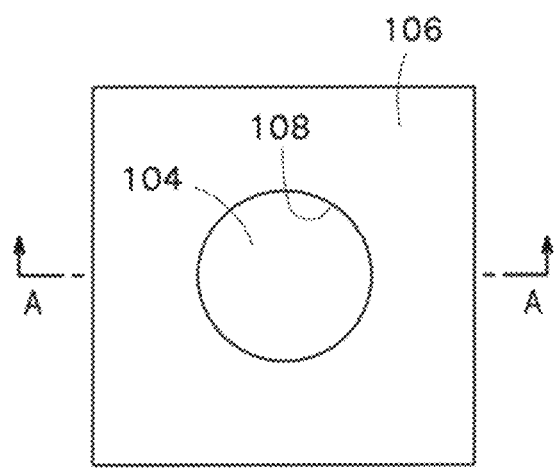

First, as illustrated in FIGS. 1A and 1B, a spin-on carbon (SOC) film (a coating-type carbon film) 102 and a spin-on glass (SOG) film (a coating-type glass film) 104 are sequentially formed on a substrate 100. The substrate 100 is, for example, a silicon substrate. In one example, a film thickness of the SOC film 102 is approximately 100 nm, and a film thickness of the SOG film 104 is approximately 35 nm.

Subsequently, the SOG film 104 is coated with a resist film 106 by a spin coating process. Then, a hole 108 having a circular pattern shape is formed in the resist film 106 by a known lithography process. The hole is typically one of many introduced into the resist, and thence the underlying film, during a patterning process to form a pattern of holes. In the lithography process, an exposure process is performed by an ArF immersion excimer laser at a power of 20 mJ/cm$^2$, for example.

Figure 2A:
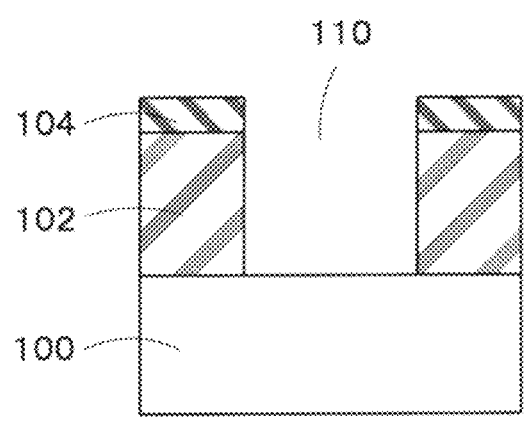
FIGS. 2A and 2B are cross-sectional views for explaining the method subsequent to FIGS. 1A and 1B.
Figure 2B:
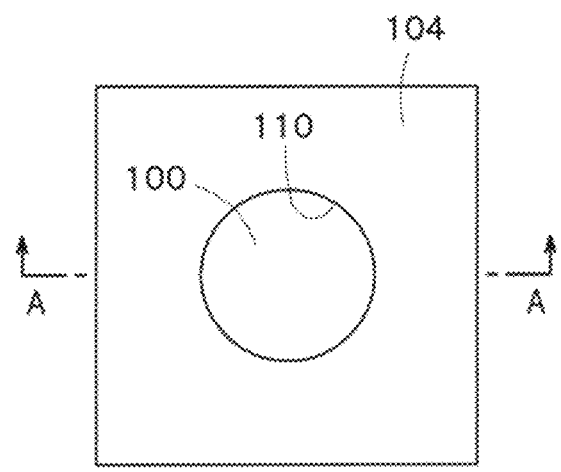

Next, as illustrated in FIGS. 2A and 2B, an etching process, such as reactive ion etching (RIE), is performed using the resist film 106 as a mask so as to process the SOG film 104 and the SOC film 102. Thus, the pattern of the hole 108 is transferred to the SOG film 104 and the SOC film 102 thereby forming a hole 110. After the hole 110 is formed, the resist film 106 is removed by a wet process.

The SOG film 104 and the SOC film 102, in which the hole 110 is formed, function as a physical guide layer for a block copolymer that is microphase separated in a subsequent process.

Figure 3A:
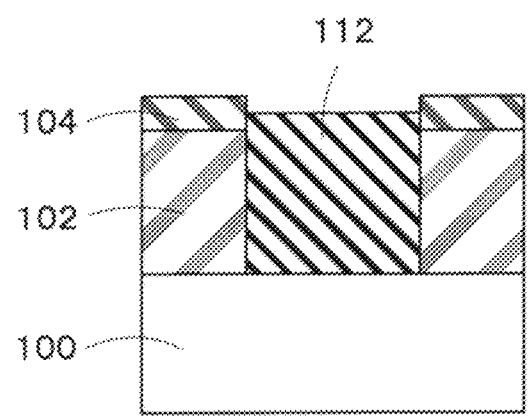
FIGS. 3A and 3B are cross-sectional views for explaining the method subsequent to FIGS. 2A and 2B.
Figure 3B:
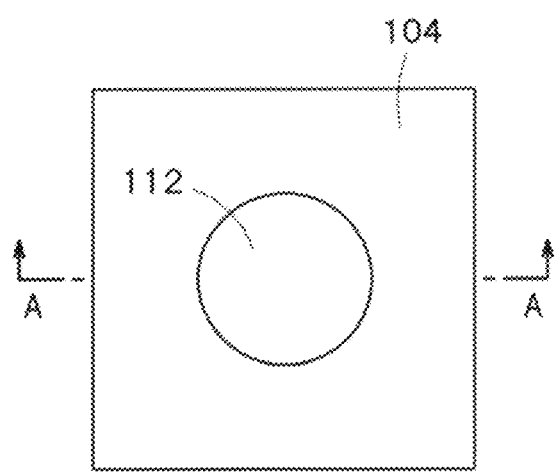

Next, as illustrated in FIGS. 3A and 3B, a block copolymer 112, having a first segment and a second segment, is applied. For example, a block copolymer (PS-b-PMMA) of polystyrene (hereinafter, referred to as PS) and polymethylmethacrylate (hereinafter, referred to as PMMA) is prepared, and a polyethylene glycol monomethyl ether acetate (PGMEA) solution containing the block copolymer at a concentration of 1.0 wt % is coated by a spin coating process. The block copolymer 112 is applied in a hole (the hole 110) of a physical guide (the SOG film 104 and the SOC film 102).

Here, a composition ratio (a molecular weight ratio) of two segments, that is, PS and PMMA, in the block copolymer is approximately 6:4. In one aspect, the molecular weights of PS and PMMA satisfy a relation that is expressed by the following formula (1).

$$\frac{35}{65} \leq \frac{\text{Molecular Weight of } PMMA}{\text{Molecular Weight of } PS} \leq \frac{45}{55} \quad (1)$$

In another aspect, the molecular weights of PS and PMMA satisfy a relation that is expressed by the following formula (2).

$$\frac{37}{63} \leq \frac{\text{Molecular Weight of } PMMA}{\text{Molecular Weight of } PS} \leq \frac{42}{58} \quad (2)$$

Figure 4A:
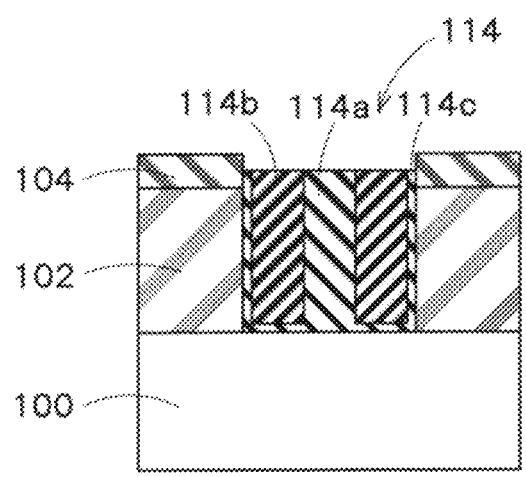
FIGS. 4A and 4B are cross-sectional views for explaining the method subsequent to FIGS. 3A and 3B.
Figure 4B:
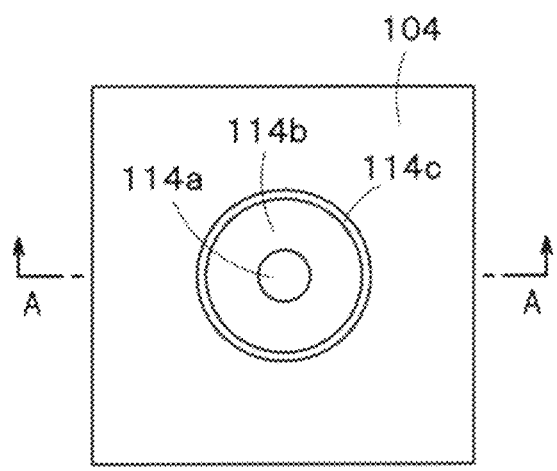

Next, as illustrated in FIGS. 4A and 4B, a heating (annealing) process is performed to facilitate the microphase separation of the block copolymer 112. A self-assembled pattern 114 which has a first polymer portion 114a containing PMMA and a second polymer portion 114b containing PS is formed by the microphase separation. The first polymer portion 114a has a cylindrical shape, and the second polymer portion 114b surrounds a lateral portion of the first polymer portion 114a. For example, the first polymer portion 114a, having a cylindrical shape and a diameter of 25 nm, is formed in the hole 110, wherein the hole 110 includes a diameter of 70 nm.

Meanwhile, a thin film (a third polymer portion 114c) is formed between the second polymer portion 114b and the physical guide and between the first and second polymer portions 114a and 114b and the substrate 100 as a result of the microphase separation of the block copolymer 112. The thin film (the third polymer portion 114c) is a mixture of PMMA and PS (first and second segments).

Figure 6:
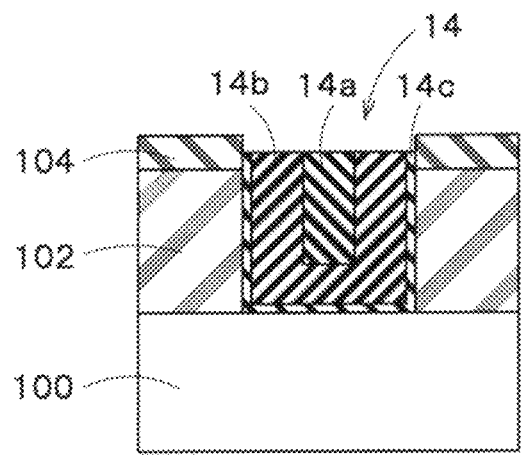
FIG. 6 is a diagram illustrating a self-assembled pattern according to a conventional example.

When a molecular weight ratio of PS to PMMA of the block copolymer used in the process illustrated in FIGS. 3A and 3B is set to 7:3, a self-assembled pattern 14, as illustrated in FIG. 6, which has a first polymer portion 14a, having a cylindrical shape and containing PMMA, and a second polymer portion 14b containing PS and surrounding a lateral portion and a bottom of the first polymer portion 14a is formed by microphase separation.

Similarly, when a block copolymer in which a molecular weight ratio of PS to PMMA is set to 5:5 is used when forming a self-assembled pattern having a lamellar shape in which the first polymer portion containing PMMA and the second polymer portion containing PS are alternately disposed. When such a block copolymer is used in the process illustrated in FIGS. 3A and 3B, it is not possible to obtain the cylindrical shape illustrated in FIGS. 4A and 4B by microphase separation.

On the other hand, according to the first embodiment, since the molecular weight ratio of PS to PMMA is set to approximately 6:4, for example, to a composition ratio satisfying the above-mentioned Formula 1, the second polymer portion 114b containing PS surrounds only the lateral portion of the first polymer portion 114a containing PMMA, and is not formed below the first polymer portion 114a (as shown in FIG. 6). In addition, the molecular weights of PS and PMMA may be set to have a ratio that is expressed by the above-mentioned Formula 2, thereby allowing the first polymer portion 114a to have a more linear cylindrical shape (a cylindrical shape with straighter sides) as illustrated in FIGS. 4A and 4B.

Figure 5A:
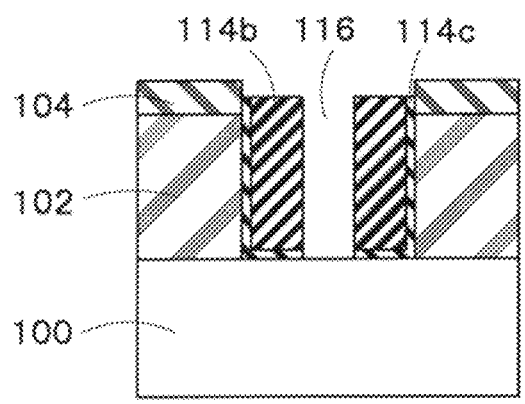
FIGS. 5A and 5B are cross-sectional views for explaining the method subsequent to FIGS. 4A and 4B.
Figure 5B:
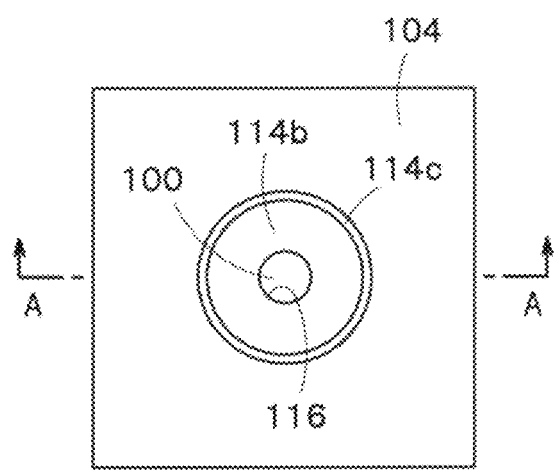

Next, as illustrated in FIGS. 5A and 5B, a wet developing process is performed, so that a second polymer portion 114b remains and the first polymer portion 114a is selectively removed. The second polymer portion 114b and the third polymer portion 114c remain (in regions adjacent to and covered by the second polymer portion 114b). For example, the self-assembled pattern 114 is irradiated with ultraviolet light and is then treated with a developing solution. When the ultraviolet light is irradiated, the PMMA is oxidized by oxygen and/or water in the atmosphere, and thus the PMMA is soluble with respect to the developing solution. As the developing solution, a developing solution capable of being used for the development of an exposed photoresist film in a photolithography technique, for example, tetramethylammonium hydroxide (TMAH) may be used.

A hole 116 that is reduced in size from the hole 110 is obtained by selectively removing the first polymer portion 114a. Since the second polymer portion 114b is not formed below the first polymer portion 114a (as shown in FIG. 6), a surface of the substrate 100 is exposed through the hole 116.

Although not shown in the drawing, thereafter, an etching process is performed using the second polymer portion 114b as a mask, thereby allowing the hole pattern 116 to be transferred to the substrate (which may comprise one or more additional films to be patterned) 100.

Figure 7:
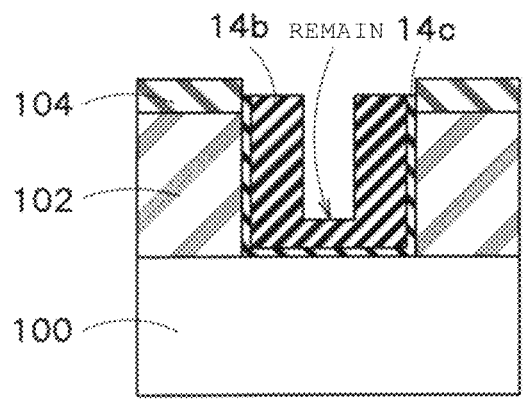
FIG. 7 is a diagram illustrating a self-assembled pattern according to a conventional example.

As illustrated in FIG. 6, when the second polymer portion 14b is formed below the first polymer portion 14a having a cylindrical shape, the second polymer portion 14b remains below the first polymer portion 14a as illustrated in FIG. 7 after removing the first polymer portion 14a. Additional etching time must be performed to remove the second polymer portion 14b remaining below the first polymer portion 14a. For this reason, processing time for etching is increased, and the size of the underlying hole may vary because the polymer portion 14b must be additionally etched through before the underlying substrate material is reached, which increases manufacturing costs and increases variation in the width of the underlying holes in the hole pattern.

According to the embodiment, the molecular weight ratio of the first segment to the second segment of the block copolymer (a self-assembled material) is set to approximately 6:4 so as not to form the second polymer portion 114b below the first polymer portion 114a having a cylindrical shape. For this reason, it is possible to prevent an increase in the manufacturing costs and to improve the reliability of DSA lithography.

In an alternative to the first embodiment the resist film 106 in which the hole 108 is formed may be used as a physical guide, instead of using the SOG film 104 and the SOC film 102 (where the hole 110 is formed). In this case, the block copolymer 112 is applied in the hole 108 (shown in FIGS. 1A and 1B) and microphase separated to form the first, second and third polymer portions (as described in FIGS. 4A and 4B). In addition, a subsequent etching process is performed using the second polymer portion 114b as a mask (as described in the process subsequent to the method described in FIGS. 5A and 5B), thereby allowing the hole 116 to be transferred to the SOG film 104 and the SOC film 102.

(Second Embodiment)

A method of forming a pattern according to a second embodiment will be described below with reference to FIGS. 8A to 12B. In FIGS. 8A to 12B, FIGS. 8B, 9B, 10B, 11B, and 12B illustrate a top surface, and FIGS. 8A, 9A, 10A, 11A, and 12A illustrate a longitudinal section along a line B-B of FIGS. 8B, 9B, 10B, 11B, and 12B.

Figure 8A:
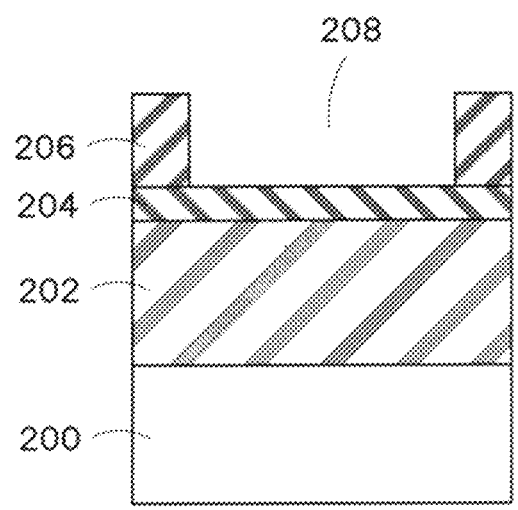
FIGS. 8A and 8B are cross-sectional views illustrating a method of forming a pattern according to a second embodiment.
Figure 8B:
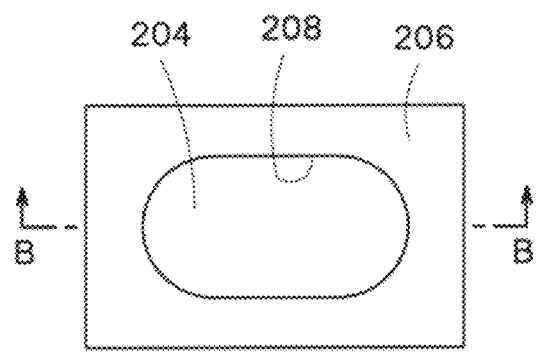

First, as illustrated in FIGS. 8A and 8B, a spin-on carbon (SOC) film (a coating-type carbon film) 202 and a spin-on glass (SOG) film (a coating-type glass film) 204 are sequentially formed on a substrate 200. The substrate 200 is, for example, a silicon substrate. In one example, a film thickness of the SOC film 202 is approximately 100 nm, and a film thickness of the SOG film 204 is approximately 35 nm.

Subsequently, the SOG film 204 is coated with a resist film 206 by a spin coating process. Then, a hole 208 having an elongated hole shape (a rectangular shape with rounded corners) is formed in the resist film 206 by a known lithography process. In the lithography process, an exposure process is performed by an ArF immersion excimer laser at a power of 20 mJ/cm², for example.

Figure 9A:
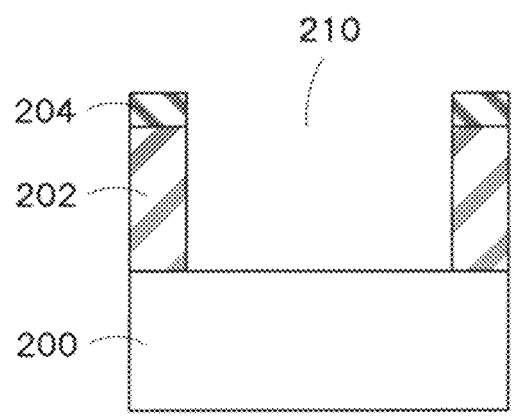
FIGS. 9A and 9B are cross-sectional views for explaining the method subsequent to FIGS. 8A and 8B.
Figure 9B:
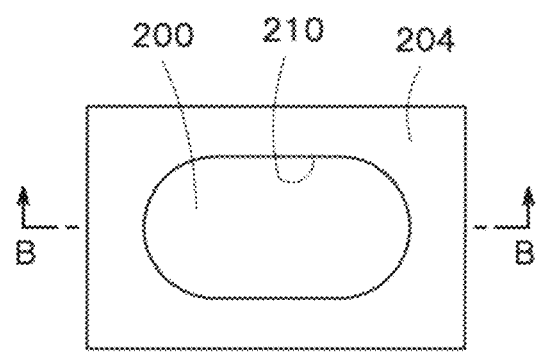

Next, as illustrated in FIGS. 9A and 9B, an etching process such as reactive ion etching (RIE) is performed using the resist film 206 as a mask so as to process the SOG film 204 and the SOC film 202. Thus, the hole 208 is transferred to the SOG film 204 and the SOC film 202, and thus a hole 210 having the elongated shape is formed. Hole 210 may be one of many holes in a pattern of holes formed in the films 202, 204. After the hole 210 is formed, the resist film 206 is removed by a wet process.

The SOG film 204 and the SOC film 202, where the hole 210 is formed, function as a physical guide layer for a block copolymer that is microphase separated in a subsequent process.

Figure 10A:
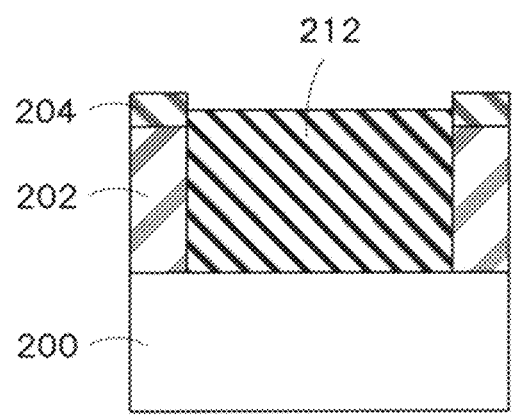
FIGS. 10A and 10B are cross-sectional views for explaining the method subsequent to FIGS. 9A and 9B.
Figure 10B:
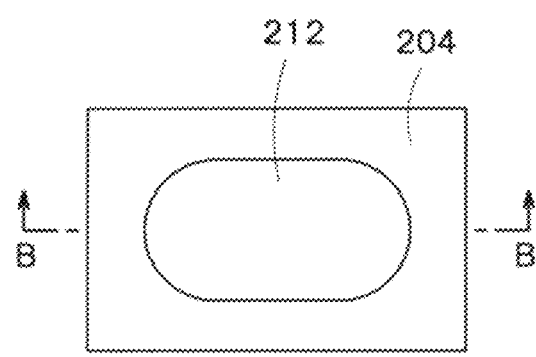

Next, as illustrated in FIGS. 10A and 10B, a block copolymer 212, which includes a first segment and a second segment is applied. For example, a block copolymer (PS-b-PMMA) of PS and PMMA is prepared, and a PGMEA solution containing the block copolymer at a concentration of 1.0 wt % is coated by a spin coating process. The block copolymer 212 is applied in the holes patterned into the films 202, 204 (for example hole 210) of the physical guide.

Here, a composition ratio (a molecular weight ratio) of two segments, that is, PS and PMMA, in the block copolymer is approximately 6:4. In one aspect, the molecular weights of PS and PMMA satisfy a relation that is expressed by the following formula (3).

$$\frac{35}{65} \leq \frac{\text{Molecular Weight of } PMMA}{\text{Molecular Weight of } PS} \leq \frac{45}{55} \quad (3)$$

In another aspect, the molecular weights of PS and PMMA satisfy a relation that is expressed by the following formula (4).

$$\frac{37}{63} \leq \frac{\text{Molecular Weight of First Segment}}{\text{Molecular Weight of Second Segment}} \leq \frac{42}{58} \quad (4)$$

Figure 11A:
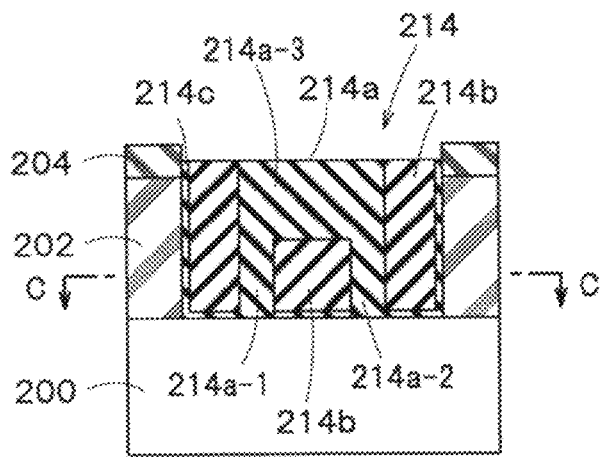
FIGS. 11A to 11C are cross-sectional views for explaining the method subsequent to FIGS. 10A and 10B.
Figure 11B:
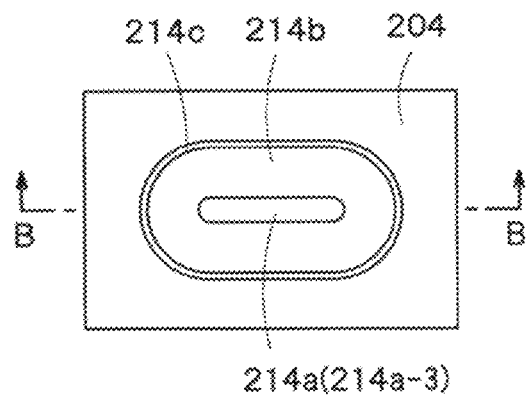
Figure 11C:
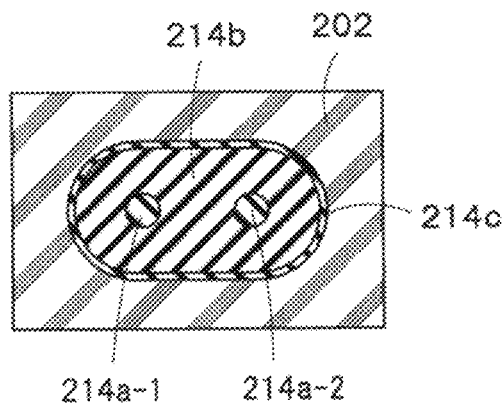

Next, as illustrated in FIGS. 11A, 11B, and 11C, a heating (annealing) process is performed to facilitate the microphase separation of the block copolymer 212. Meanwhile, FIG. 11C is a cross-sectional view along a line C-C of FIG. 11A.

A self-assembled pattern 214 which has a first polymer portion 214a containing PMMA and a second polymer portion 214b containing PS is formed by microphase separation. The first polymer portion 214a is constituted by two lower portions 214a-1 and 214a-2 having a cylindrical shape, and an elongated upper portion 214a-3 (bridge portion) that connects the lower portion 214a-1 and the lower portion 214a-2 to each other. The second polymer portion 214b surrounds a lateral portion of the first polymer portion 214a. The lower portion 214a-1 and the lower portion 214a-2 are separated from each other by the second polymer portion 214b.

In other words, the self-assembled pattern 214 has two PMMA portions having a cylindrical shape which have the upper portions being connected to each other and the lower portions being separated from each other by a PS portion.

Meanwhile, a thin film (a third polymer portion 214c) is formed between the second polymer portion 214b and the physical guide, and between the first and second polymer portions 214a and 214b and the substrate 200, as a result of the microphase separation. The thin film (the third polymer portion 214c) is a mixture of PMMA and PS.

When a molecular weight ratio of PS to PMMA of the block copolymer, used in the process illustrated in FIGS. 10A and 10B is set to 7:3, two different self assembled patterns may result: A self-assembled pattern 34 illustrated in FIGS. 13A and 13B may be formed by microphase separation, or a self-assembled pattern 44 illustrated in FIGS. 14A and 14B may be formed by microphase separation.

Figure 13A:
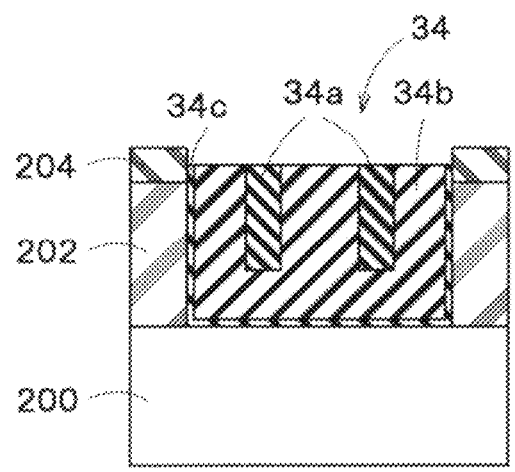
FIGS. 13A and 13B are diagrams illustrating a self-assembled pattern according to a conventional example.
Figure 13B:
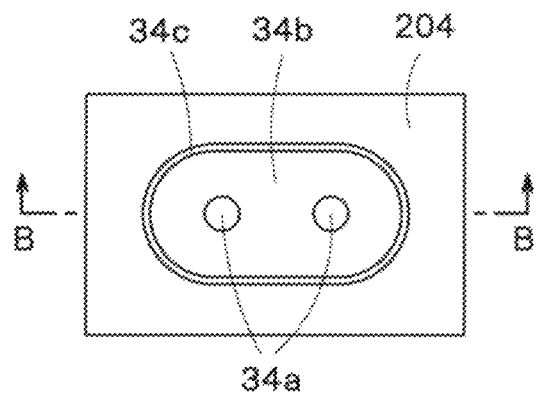

As illustrated in FIGS. 13A and 13B, the self-assembled pattern 34 has two first polymer portions 34a having a cylindrical shape, which include PMMA, and a second polymer portion 34b containing PS and surrounding lateral portions and bottoms of the first polymer portions 34a.

Figure 14A:
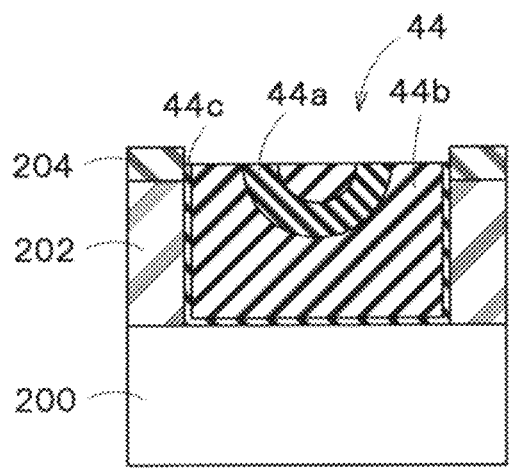
FIGS. 14A and 14B are diagrams illustrating a self-assembled pattern according to a conventional example.
Figure 14B:
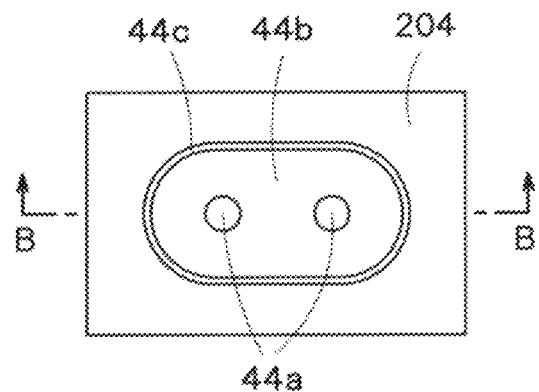

In addition, as illustrated in FIGS. 14A and 14B, the self-assembled pattern 44 includes a first polymer portion 44a having a half-donut shape, which contains PMMA, and has upper portions being separated from each other while the lower portions are connected to each other, and a second polymer portion 44b surrounding a lateral portion and a bottom of the first polymer portion 44a.

On the other hand, according to the embodiment, since the molecular weight ratio of PS to PMMA is set to approximately 6:4, for example, to a composition ratio satisfying the above-mentioned Formula 3, the second polymer portion 214b containing PS surrounds the lateral portions of the lower portions 214a-1 and 214a-2 of the first polymer portion 214a which have a cylindrical shape, and is not formed below the lower portions 214a-1 and 214a-2. In addition, the molecular weights of PS and PMMA may be set to have a relation that is expressed by the above-mentioned Formula 4, thereby allowing the lower portions 214a-1 and 214a-2 to have a more linear cylindrical shape.

Figure 12A:
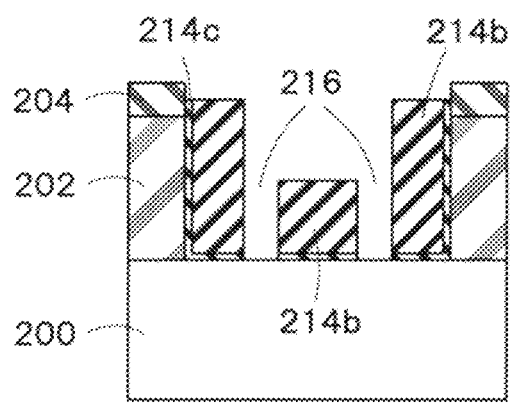
FIGS. 12A and 12B are cross-sectional views for explaining the method subsequent to FIGS. 11A to 11C.
Figure 12B:
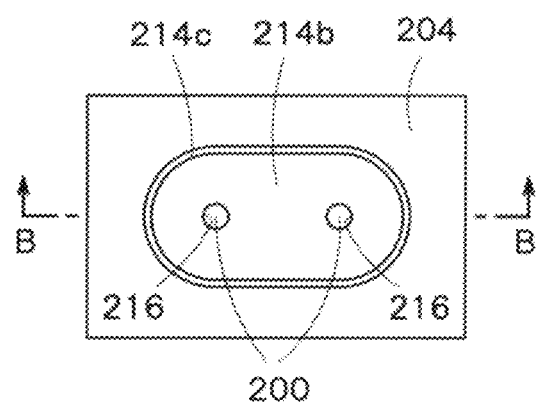

Next, as illustrated in FIGS. 12A and 12B, a wet developing process is performed, so that a second polymer portion 214b remains and the first polymer portion 214a is selectively removed. The same developing solution as that in the above-mentioned first embodiment may be used in the wet developing process. Thus, two holes 216 are obtained. Since the second polymer portion 214b is not formed below the lower portions 214a-1 and 214a-2 having a cylindrical shape, a surface of the substrate 200 is exposed through the holes 216.

Although not shown in the drawing, thereafter, an etching process is performed using the second polymer portion 214b as a mask, thereby allowing two holes 216 to be transferred to the substrate (a film to be processed) 200.

As illustrated in FIGS. 13A and 13B, when the second polymer portion 34b is formed below the first polymer portions 34a having a cylindrical shape, the second polymer portion 34b remains below the first polymer portions 34a after removing the first polymer portions 34a. For this reason, manufacturing costs of etching in the subsequent process is decreased using the pattern of FIG. 12 as compared to the prior art pattern shown in FIG. 13A. Further, in the prior art, the two hole pattern may not be successfully formed due to the shape and locations of the remaining second polymer portions 34b after etching, i.e., the etching through the remaining portion of polymer portion 34b above the substrate 200 may destroy the definition of the two holes.

In addition, as illustrated in FIGS. 14A and 14B, when the first polymer portion 44a having a half-donut shape, which has the lower portions being connected to each other is formed, it is not possible to form two hole pattern even if the first polymer portion 44a is selectively removed.

On the other hand, according to the embodiment, the molecular weight ratio of the first segment to the second segment of the block copolymer (a self-assembled material) is set to approximately 6:4 so as not to form the second polymer portion 214b below the two lower portions 214a-1 and 214a-2 of the first polymer portion 214a, which have a cylindrical shape. For this reason, it is possible to prevent an increase in manufacturing costs due to the need for less etching in subsequent processes and to improve the reliability of DSA lithography by removing variance in the width of holes required to remove the second polymer portion at the bottom thereof, overlying the substrate.

In an alternative to the second embodiment, the resist film 206 in which the hole pattern 208 is formed may be used as a physical guide instead of using the SOG film 204 and the SOC film 202 (where the hole pattern 210 is formed. In this case, the block copolymer 212 is applied in the hole pattern 208 (shown in FIGS. 8A and 8B). In addition, a subsequent etching process is performed using the second polymer portion 214b as a mask (as described in the process subsequent to the method described in FIGS. 12A and 12B), thereby allowing the pattern of the hole 216 to be transferred to the SOG film 204 and the SOC film 202.

In the above-mentioned second embodiment, although an example is described where the two hole pattern 216 is formed in one opening portion of the physical guide, a three or more hole pattern 216 may be formed by adjusting the shape and/or number of the opening portion (the hole pattern 210) of the physical guide.

In the above-mentioned first and second embodiments, although the block copolymer of PS and PMMA is used as the block copolymers 112 and 212, any of other materials such as a block copolymer of PS and polydimethylsiloxane (PDMS) may be used. Even when using other materials, a molecular weight ratio of a segment having a cylindrical shape by microphase separation to a segment surrounding the cylindrical shape be set to approximately 4:6. In addition, a molar volume ratio of the segment having a cylindrical shape by microphase separation to the segment surrounding the cylindrical shape may be set to approximately 4:6.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of forming a pattern, comprising:
   forming a pattern having an opening on a film to be processed;
   depositing a polymer material having a first polymer segment and a second polymer segment in the opening;
   heating the polymer material to achieve microphase separation of the polymer material into a first polymer phase portion including the first polymer segment, and a second polymer phase portion including the second polymer segment, the first polymer phase portion including an upper portion having a rectangular plate shape with rounded corners and a plurality of lower portions each of which extends from the upper portion as a cylindrical shape, and the second polymer phase portion surrounding the first polymer phase portion; and
   selectively removing the first polymer phase portion,
   wherein molecular weights of the first polymer segment and the second polymer segment satisfy the following formula:

$37/63 \leq$ (the molecular weight of the first polymer segment)/(the molecular weight of the second polymer segment)$\leq 42/58$.

2. The method according to claim 1, wherein the pattern having the opening comprises a guide formed on the film to be processed, and
   a plurality of hole patterns is formed in the guide by selective removal of the first polymer phase portion.

3. The method according to claim 2, wherein the second polymer phase portion is not formed below the lower portions of the first polymer phase portion.

4. The method according to claim 1, wherein the second polymer phase portion is not formed below the lower portions of the first polymer phase portion.

5. The method according to claim 1, wherein the second polymer phase portion is not formed between the lower portions of the first polymer phase portion and the film to be processed.

6. The method according to claim 1, wherein the opening has a rectangular plate shape with rounded corners.

7. A method of forming a pattern, comprising:
   applying a polymer material containing a first segment and a second segment in an opening portion of a guide;
   heating the polymer material to achieve microphase separation of the polymer material to form a self-assembled pattern including a first phase portion including the first segment and a second phase portion including the second segment, the first phase portion including an upper portion having a rectangular plate shape with rounded corners and a plurality of lower portions each of which extends from the upper portion as a cylindrical shape, and the second phase portion surrounding the first phase portion; and
   selectively removing the first phase portion,
   wherein molecular weights of the first segment and the second segment in the polymer material satisfy the following formula $$\frac{35}{65} \leq \frac{\text{Molecular Weight of First Segment}}{\text{Molecular Weight of Second Segment}} \leq \frac{45}{55}.$$

8. The method according to claim 7, wherein the molecular weights of the first segment and the second segment in the polymer material satisfy the following formula $$\frac{37}{63} \leq \frac{\text{Molecular Weight of First Segment}}{\text{Molecular Weight of Second Segment}} \leq \frac{42}{58}.$$

9. The method according to claim 8, wherein the guide is formed on a film to be processed, and
   a plurality of hole patterns is formed on the film by selective removal of the first phase portion.

10. The method according to claim 9, wherein the second phase portion is not formed below the lower portions of the first phase portion.

11. The method according to claim 7, wherein the guide is formed on a film to be processed, and
   a plurality of hole patterns is formed on the film by selective removal of the first phase portion.

12. The method according to claim 11, wherein the second phase portion is not formed below the lower portions of the first phase portion.

13. The method according to claim 7, wherein the second phase portion is not formed below the lower portions of the first phase portion.

14. The method according to claim 7, wherein the second phase portion is not formed between the lower portions of the first phase portion and a film to be processed.

15. The method according to claim 7, wherein the opening portion has a rectangular plate shape with rounded corners.

\* \* \* \* \*